(12) United States Patent
Kim et al.

(10) Patent No.: US 8,546,838 B2
(45) Date of Patent: *Oct. 1, 2013

(54) LIGHT EMITTING DEVICE PACKAGE AND METHOD FOR MANUFACTURING THE SAME

(75) Inventors: Geun Ho Kim, Seoul (KR); Seung Yeob Lee, Gyeonggi-do (KR); Yu Ho Won, Seoul (KR)

(73) Assignees: LG Electronics Inc., Seoul (KR); LG Innotek Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/191,247

(22) Filed: Jul. 26, 2011

(65) Prior Publication Data

US 2011/0278627 A1    Nov. 17, 2011

Related U.S. Application Data

(63) Continuation of application No. 11/706,251, filed on Feb. 15, 2007, now Pat. No. 8,097,896.

(30) Foreign Application Priority Data

Dec. 21, 2006    (KR) .................. 10-2006-0131732

(51) Int. Cl.
*H01L 33/48*    (2010.01)
(52) U.S. Cl.
USPC .......... 257/99; 257/98; 257/100; 257/E33.058
(58) Field of Classification Search
CPC ... H01L 25/167; H01L 33/60; H01L 27/0248; H01L 29/866
USPC ............... 257/98–100, 106, 603, E33.058, 257/E29.335, E33.072
See application file for complete search history.

(56) References Cited

U.S. PATENT DOCUMENTS

| 6,054,716 A | * | 4/2000 | Sonobe et al. ............... 250/552 |
| 6,114,240 A | | 9/2000 | Akram et al. |

(Continued)

FOREIGN PATENT DOCUMENTS

| CN | 1734800 A | 2/2006 |
| EP | 1603170 A1 | 12/2005 |

(Continued)

OTHER PUBLICATIONS

"Optical Properties of Selected Elements," in CRC Handbook of Chemistry and Physics, 92nd Edition (Internet Version 2012), W. M. Haynes, ed., CRC Press/Taylor and Francis, Boca Raton, FL.*

*Primary Examiner* — Anthony Ho
*Assistant Examiner* — Yu Chen
(74) *Attorney, Agent, or Firm* — Birch, Stewart, Kolasch & Birch, LLP

(57) ABSTRACT

A light emitting device package capable of achieving an enhancement in light emission efficiency and a reduction in thermal resistance, and a method for manufacturing the same are disclosed. The method includes forming a mounting hole in a first substrate, forming through holes in a second substrate, forming a metal film in the through holes, forming at least one pair of metal layers on upper and lower surfaces of the second substrate such that the metal layers are electrically connected to the metal film, bonding the first substrate to the second substrate, and mounting at least one light emitting device in the mounting hole such that the light emitting device is electrically connected to the metal layers formed on the upper surface of the second substrate.

30 Claims, 10 Drawing Sheets

(56) References Cited

U.S. PATENT DOCUMENTS

| | | |
|---|---|---|
| 7,514,867 B2 | 4/2009 | Yano et al. |
| 8,097,896 B2 * | 1/2012 | Kim et al. ............... 257/99 |
| 2003/0119308 A1 | 6/2003 | Geefay et al. |
| 2004/0217369 A1 | 11/2004 | Nitta et al. |
| 2005/0067628 A1 * | 3/2005 | Kuwabara et al. ........ 257/98 |
| 2005/0121686 A1 | 6/2005 | Keller et al. |
| 2005/0184387 A1 * | 8/2005 | Collins et al. .......... 257/712 |
| 2006/0054910 A1 | 3/2006 | Takemori et al. |
| 2006/0131601 A1 * | 6/2006 | Ouderkirk et al. ........ 257/99 |
| 2006/0147746 A1 | 7/2006 | Wakako et al. |
| 2006/0245188 A1 | 11/2006 | Takenaka |
| 2006/0267037 A1 | 11/2006 | Lim et al. |
| 2007/0170450 A1 | 7/2007 | Murphy |
| 2007/0200128 A1 * | 8/2007 | Yano ..................... 257/99 |
| 2008/0023711 A1 | 1/2008 | Tarsa et al. |
| 2008/0164482 A1 | 7/2008 | Obara et al. |
| 2008/0203420 A1 * | 8/2008 | Higaki et al. ............ 257/99 |

FOREIGN PATENT DOCUMENTS

| | | |
|---|---|---|
| JP | 11-46018 A | 2/1999 |
| JP | 2002-232017 A | 8/2002 |
| JP | 2004-289106 A | 10/2004 |
| JP | 2004-319939 A | 11/2004 |
| JP | 2005-166937 A | 6/2005 |
| JP | 2006-86176 A | 3/2006 |
| JP | 2006-100688 A | 4/2006 |
| JP | 2006-261290 A | 9/2006 |
| JP | 2006-310204 A | 11/2006 |
| KR | 10-0593937 B1 | 6/2006 |
| KR | 10-2006-0080336 A | 7/2006 |
| KR | 10-2006-0087048 A | 8/2006 |
| TW | 200610189 A | 3/2006 |
| WO | WO 2005/031882 A1 | 4/2005 |
| WO | WO 2005031882 A1 * | 4/2005 |
| WO | WO 2005/062393 A2 | 7/2005 |
| WO | WO 2005/106978 A1 | 11/2005 |
| WO | WO 2006013731 A1 * | 2/2006 |
| WO | WO 2006/054616 A1 | 5/2006 |

* cited by examiner

LIGHT EMITTING DEVICE PACKAGE AND METHOD FOR MANUFACTURING THE SAME

CROSS-REFERENCE TO RELATED APPLICATIONS

This application is a Continuation of application Ser. No. 11/706,251 filed Feb. 15, 2007 now U.S. Pat. No. 8,097,896, which claims the benefit of Korean Patent Application No. 10-2006-0131732, filed on Dec. 21, 2006. The entire contents of each of these applications are incorporated herein by reference.

BACKGROUND OF THE INVENTION

1. Field of the Invention

The present invention relates to a light emitting device package and a method for manufacturing the same, and more particularly, to a light emitting device package capable of achieving an enhancement in light emission efficiency and a reduction in thermal resistance, and a method for manufacturing the same.

2. Discussion of the Related Art

Light emitting diodes (LEDs) are well known as a semiconductor light emitting device which converts current to light, to emit light. Since a red LED using GaAsP compound semiconductor was commercially available in 1962, it has been used, together with a GaP:N-based green LED, as a light source in electronic apparatuses, for image display.

The wavelength of light emitted from such an LED depends on the semiconductor material used to fabricate the LED. This is because the wavelength of the emitted light depends on the band gap of the semiconductor material representing energy difference between valence-band electrons and conduction-band electrons.

Gallium nitride (GaN) compound semiconductor has been highlighted in the field of high-power electronic devices because it exhibits a high thermal stability and a wide band gap of 0.8 to 6.2 eV. One of the reasons why GaN compound semiconductor has been highlighted is that it is possible to fabricate a semiconductor layer capable of emitting green, blue, or white light, using GaN in combination with other elements, for example, indium (In), aluminum (Al), etc.

Thus, it is possible to adjust the wavelength of light to be emitted, using GaN in combination with other appropriate elements. Accordingly, where GaN is used, it is possible to appropriately determine the materials of a desired LED in accordance with the characteristics of the apparatus to which the LED is applied. For example, it is possible to fabricate a blue LED useful for optical recording or a white LED to replace a glow lamp.

On the other hand, initially-developed green LEDs were fabricated using GaP. Since GaP is an indirect transition material causing a degradation in efficiency, the green LEDs fabricated using this material cannot practically produce light of pure green. By virtue of the recent success of growth of an InGaN thin film, however, it has been possible to fabricate a high-luminescent green LED.

By virtue of the above-mentioned advantages and other advantages of GaN-based LEDs, the GaN-based LED market has rapidly grown. Also, techniques associated with GaN-based electro-optic devices have rapidly developed since the GaN-based LEDs became commercially available in 1994.

GaN-based LEDs have been developed to exhibit light emission efficiency superior over that of glow lamps. Currently, the efficiency of GaN-based LEDs is substantially equal to that of fluorescent lamps. Thus, it is expected that the GaN-based LED market will grow significantly.

By virtue of such technical development, the application of GaN-based LEDs has been extended not only to display devices, but also to an LED backlight substituted for a cold cathode fluorescent lamp (CCFL) used for a backlight of a liquid crystal display (LCD) device, a white LED lighting device usable as a substitute for a fluorescent lamp or a grow lamp, and signal lamp.

Meanwhile, in addition to LEDs driven by DC power, high-voltage AC LED chips, which can be driven even by general AC power, have also been developed. For such an application, LEDs should exhibit a high operating voltage, a small drive current, a high light emission efficiency, and a high brightness at the same electric power.

Referring to FIG. 1, a structure of a general LED is illustrated. As shown in FIG. 1, a buffer layer 2, an n-type semiconductor layer 3, an active layer 4, and a p-type semiconductor layer 5 are sequentially deposited over a substrate 1 made of, for example, sapphire. Mesa patterning is then performed such that the n-type semiconductor layer 3 is exposed. Thereafter, a current diffusion layer 6 is formed on the p-type semiconductor layer 5, as a transparent electrode having a high light transmissivity.

For electrical connection of the LED to an external circuit, a p-type electrode 7 and an n-type electrode 8 are subsequently formed over the p-type semiconductor layer 5 and n-type semiconductor layer 3, respectively. Thus, an LED structure 10 is completely formed.

When a voltage from the external circuit is applied between the p-type electrode 7 and the n-type electrode 8 in the LED, holes and electrons enter the p-type electrode 7 and n-type electrode 8, respectively. The holes and electrons are re-coupled in the active layer 4, so that surplus energy is converted into light which is, in turn, externally emitted through the transparent electrode and substrate.

At this time, static electricity and a surge voltage may be applied to the p-type electrode 7 and n-type electrode 8 electrically connected to the external circuit, so that overcurrent may flow through the LED structure 10. In this case, the semiconductor is damaged, so that the LED can be no longer used.

In order to solve this problem, a voltage regulator is electrically connected to the LED. When overcurrent is generated, the voltage regulator bypasses the generated overcurrent, thereby preventing damage of the LED chip.

For such a voltage regulator, a zener diode using zener breakdown is mainly used. When a diode is fabricated to have a very high impurity concentration, it has a space charge region width. In this case, a strong electric field is generated even at a small reverse voltage.

The strong electric field generated as above releases covalent bonds of a lattice, thereby producing a number of free electrons and a number of free holes. As a result, an abrupt reverse current flows under the condition in which there is little voltage variation. In accordance with such a zener diode function, it is possible to prevent damage of the LED chip.

In an example of a conventional package using such a zener diode, a cup-shaped curved portion is formed at a lead frame, and an LED is bonded to the curved portion of the lead frame. In this case, a voltage regulator such as a zener diode is bonded to another lead frame of the package. The lead frames are then wire-bonded to connect the voltage regulator and LED in parallel.

In the above-mentioned conventional method, there may be a degradation in electrical and optical characteristics and an increase in costs because it is necessary to form the cup-shaped curved portion, and to connect the voltage regulator, which is separately prepared, using an off chip method.

SUMMARY OF THE INVENTION

Accordingly, the present invention is directed to a light emitting device package and a method for manufacturing the same that substantially obviate one or more problems due to limitations and disadvantages of the related art.

An object of the present invention is to provide a light emitting device package capable of achieving easy formation of a reflection film adapted to forwardly reflect light laterally emitted from a light emitting device, achieving an enhancement in voltage withstand characteristics, and achieving easy external emission of heat through a ceramic or silicon body exhibiting a superior thermal conductivity.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for manufacturing a light emitting device package comprises: forming a mounting hole in a first substrate; forming through holes in a second substrate; forming a metal film in the through holes; forming at least one pair of metal layers on upper and lower surfaces of the second substrate such that the metal layers are electrically connected to the metal film; bonding the first substrate to the second substrate; and mounting at least one light emitting device in the mounting hole such that the light emitting device is electrically connected to the metal layers formed on the upper surface of the second substrate.

In another aspect of the present invention, a light emitting device package comprises: a first substrate having at least one pair of through holes, and a metal film or a conductive film formed in each through hole; a second substrate arranged on the first substrate, the second substrate having a light emitting device mounting hole, and a reflection film formed on a side wall surface of the mounting hole; first electrodes arranged between the first substrate and the second substrate, each first electrode being connected to the metal film or the conductive film formed in an associated one of the through holes; and at least one light emitting device arranged in the mounting hole, and electrically connected to the first electrodes.

In another aspect of the present invention, a light emitting device package comprises: a first substrate having a first surface, a second surface, and first and second electrodes respectively formed on the first and second surfaces and connected to each other; a second substrate arranged on the first substrate, the second substrate having a light emitting device mounting hole, and a reflection film formed on a side wall surface of the mounting hole; and zener diodes each electrically connected between one of the first and second substrates and an associated one of the first electrodes.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIGS. 3 to 10 are sectional views illustrating the first embodiment of the present invention, in which:

FIG. 3 is a sectional view illustrating formation of a mask layer on an upper substrate;

FIG. 4 is a sectional view illustrating formation of a mounting hole;

FIG. 5 is a sectional view illustrating formation of a diffusion layer;

FIG. 6 is a sectional view illustrating formation of a reflection film;

FIG. 7 is a sectional view illustrating formation of through holes in a lower substrate;

FIG. 8 is a sectional view illustrating formation of a metal film in each through hole; and FIG. 9 is a sectional view illustrating formation of a metal layer;

FIG. 10 is a sectional view illustrating the light emitting device package according to the first embodiment of the present invention;

DETAILED DESCRIPTION OF THE INVENTION

Figure 1:
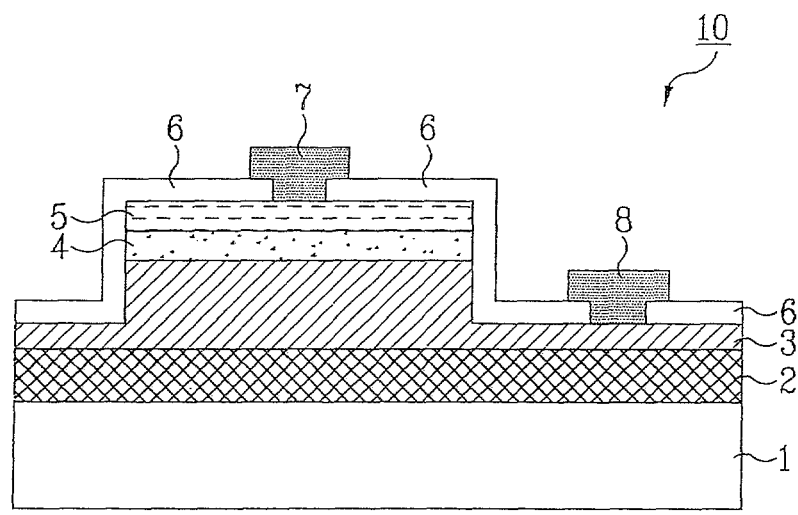
FIG. 1 is a sectional view illustrating an example of a general light emitting device.

Reference will now be made in detail to the preferred embodiments of the present invention, examples of which are illustrated in the accompanying drawings.

The present invention may, however, be embodied in many alternate forms and should not be construed as limited to the embodiments set forth herein. Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims.

Like numbers refer to like elements throughout the description of the figures. In the drawings, the thickness of layers and regions are exaggerated for clarity.

It will be understood that when an element such as a layer, region or substrate is referred to as being "on" another element, it can be directly on the other element or intervening elements may also be present. It will also be understood that if part of an element, such as a surface, is referred to as "inner," it is farther to the outside of the device than other parts of the element.

In addition, relative terms, such as "beneath" and "overlies", may be used herein to describe one layer's or region's relationship to another layer or region as illustrated in the figures.

It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms.

These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

First Embodiment

Figure 2:
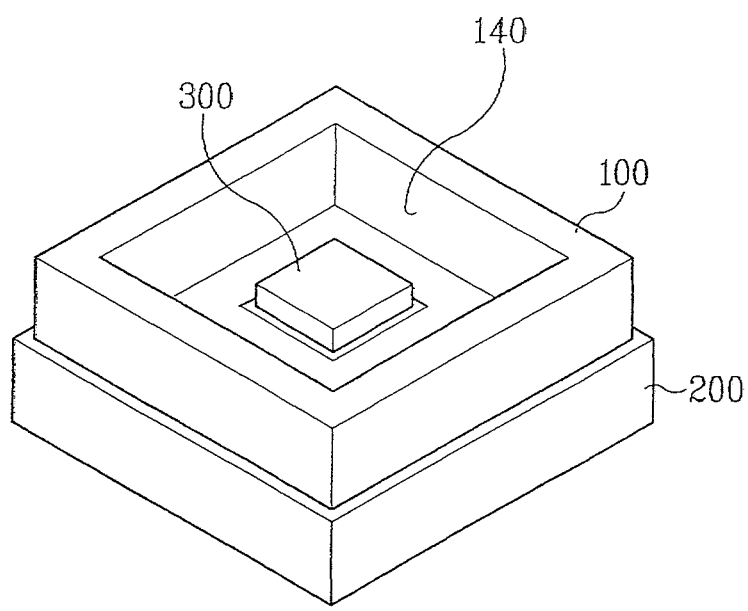
FIG. 2 is a perspective view illustrating a light emitting device package according to a first embodiment of the present invention.

Referring to FIG. 2, a light emitting device package according to a first embodiment of the present invention is illustrated. The light emitting device package includes an upper substrate 100 and a lower substrate 200. A light emitting device 300 is mounted on the lower substrate 200. The lower substrate 200 is made of a material having a heat transfer coefficient. The upper substrate 100 is bonded to the lower substrate 200, and is provided with a reflection film for forwardly reflecting light emitted from the light emitting device 300.

The material of the lower substrate 200 may be ceramic such as SiC, AlN, or graphite having a high heat transfer coefficient. Here, the ceramic means a material such as an oxide, nitride, or carbide containing mineral elements as major components. Such a material, namely, the oxide, nitride or carbide, may be used for the lower substrate 200.

In addition, PCB, BeO, SiO, Si, Al, AlO$_x$, PSG, a synthetic resin (plastic) material such as epoxy resin, ceramic or Al$_2$O$_3$ may be used.

The reason why the material having a high heat transfer coefficient should be used is to rapidly transfer heat generated from the light emitting device 300 to a heat sink, PCB, or metal core PCB (MCPCB). It is preferable to use a material having a heat transfer coefficient of 100 W/mk or more.

The upper substrate 100 may be made of semiconductor such as silicon (Si). In the upper substrate 100 made of such semiconductor, zener diodes may be formed in order to achieve an improvement in voltage withstand characteristics.

Hereinafter, a process for manufacturing the light emitting device package according to the first embodiment of the present invention will be described.

First, a mask layer 110 for an etching process is formed to form a mounting hole in the upper substrate 100.

Figure 3:
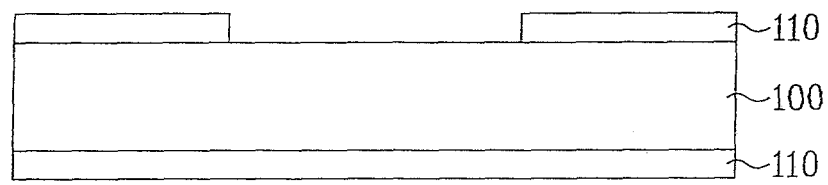

For example, as shown in FIG. 3, a wet etch mask is formed over the upper substrate 100 which is made of silicon such that an anisotropic wet etch can be implemented for the upper substrate 100. Thereafter, the wet etch mask is removed from a region where the mounting hole 120 (FIG. 4) will be formed, to expose a corresponding portion of the upper substrate 100. The mask layer 110 is then formed, as shown in FIG. 3.

Figure 4:
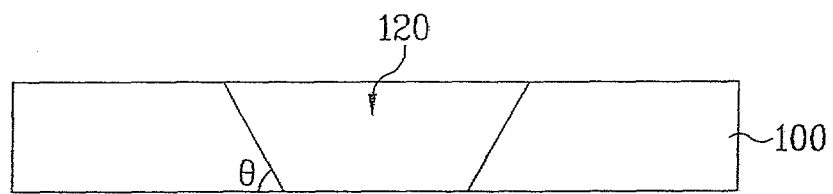

Next, as shown in FIG. 4, a wet etch process is carried out, using an etching solution capable of anisotropically wet-etching silicon, such that a through hole is formed through the upper substrate 100. Thus, the mounting hole 120 is formed. After the formation of the mounting hole 120, the remaining mask layer 110 is completely removed.

Where the mounting hole 120 is formed in accordance with the anisotropic wet etch, the formation of the mounting hole 120 may be carried out such that the mounting hole has an inclined edge surface with a certain inclination angle θ, as shown in FIG. 4.

The inclination angle θ is an angle defined between the inclined surface of the mounting hole 120 and a bottom surface arranged beneath the mounting hole 120 without being formed with the mounting hole 120. The inclination angle θ may range from 35° to 70°.

The inclined surface will form a reflection surface for extraction of light laterally emitted from the light emitting device which will be subsequently mounted. Accordingly, it is most theoretically preferred that the inclination angle θ be 54.7°, taking into consideration the distribution and direction of light horizontally emitted from the light emitting device. However, practically, the inclination angle θ may range from 50° to 60°.

Meanwhile, the light emitting device may have inclined side surfaces. Taking into consideration such conditions, the inclination angle θ of the mounting hole 120 may be determined to be within a range of 35° to 70°.

Zener diodes may be formed in the upper surface 100 formed with the mounting hole 120, in order to compensate for weak voltage withstand characteristics of the light emitting device. Hereinafter, a method for forming such zener diodes will be described.

In a certain region of the upper substrate 100, which is doped with an impurity in an appropriate concentration, an impurity having a conductivity opposite to that of the impurity doped in the upper substrate 100 is diffused to form a diffusion layer 131. Thus, zener diodes 130 (FIG. 5) are formed.

Figure 5:
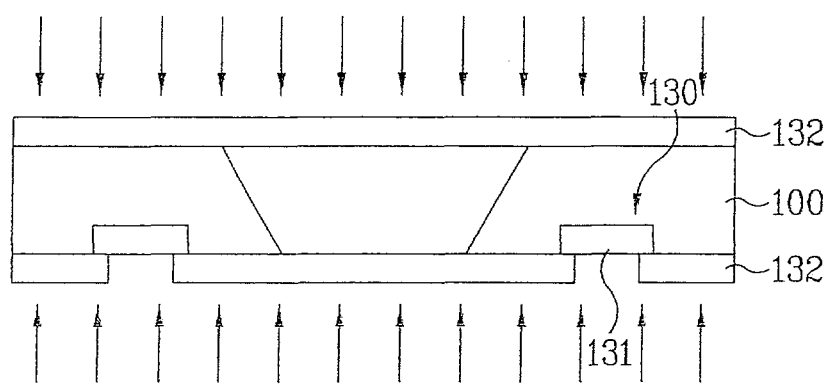
Figure 6:
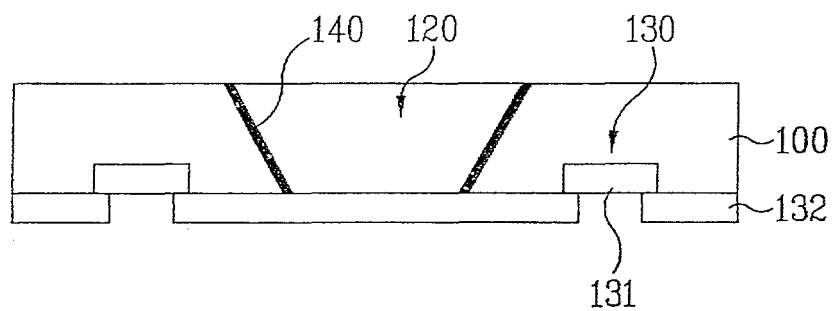

For such a selective impurity diffusion, as shown in FIG. 5, a diffusion mask 132 is first deposited over the upper substrate 100. Thereafter, the diffusion mask 132 is patterned, in order to enable the impurity having the conductivity type opposite to that of the upper substrate 100 to penetrate into the upper substrate 100.

After the patterning enabling the selective diffusion of the impurity in the upper substrate 100 through the diffusion mask 132, a diffusion process is carried out in an impurity diffusing furnace, to form the diffusion layer 131.

After completion of the diffusion process, the diffusion mask 132 is removed, and an insulating layer is deposited over the upper surface 100. Thereafter, a pad open process (not shown) may be carried out, to electrically connect the zener diodes 130 to the external circuit.

After the formation of the diffusion layer 131 for forming the zener diodes 130, a reflection film 140 exhibiting a high reflectivity of 70% or more at wavelengths in a visible ray range, ultraviolet ray range, and infrared ray range is formed on the inner side wall surface (inclined surface) of the mounting hole 120, using Ag, Al, Mo, or Cr, in order to enhance the reflectivity of the inner side wall surface.

Generally, metal thin films exhibit a high reflectivity, as compared to other materials, because they have unique metallic gloss. However, it is advantageous to form a reflection film having a reflectivity of a certain value or more, in order to effectively externally guide light emitted from the light emitting device.

The reflectivity of the reflection film 140 at wavelengths in a visible ray range, ultraviolet ray range, and infrared ray range may depend on the material of the reflection film 140 and the formation method for the reflection film 140. However, it is possible to form the reflection film 140, which has a reflectivity of 70% or more, by using a material such as Ag, Al, Mo, or Cr, as described above, and a formation method which will be described hereinafter.

The reflection film 140 may be formed by depositing a metal thin film using a semiconductor process such as a sputtering process or an evaporation process, and patterning the metal thin film in accordance with a photolithography process such that the metal thin film remains only in desired regions.

Alternatively, the photolithography process may be first carried out to deposit the reflection film 140. In this case, a lift-off process may be subsequently carried out. In accordance with another method, a seed metal is deposited, and then patterned in accordance with a photolithography process. A metal plating process is then carried out for the patterned seed metal, to form the reflection film 140.

Figure 7:

Thereafter, as shown in FIG. 7, through holes 210 is formed through the lower substrate 200, which is a ceramic substrate having a high heat transfer coefficient and a superior insulation property, using a punching technique or a laser machining technique.

For the ceramic material, which has a high heat transfer coefficient and a superior insulation property, AlN, SiC, graphite, etc. may be used. It is preferable to use a ceramic material having a high heat transfer coefficient of 100 W/mk or more.

The through holes 210 may be formed in regions where the mounting hole 120 of the upper substrate 100 is not positioned under the condition in which the upper substrate 100 and lower substrate 100 are bonded to each other in an aligned state.

Alternatively, the through holes 210 may be formed in regions arranged outside a region where the light emitting device mounted to the upper substrate 100 will be bonded to the lower substrate 200, but arranged within a region corresponding to the mounting hole 120.

Where the through holes 210 are formed outside the mounting hole 120, as described above, they may be positioned such that dicing lines, along which the package structure will be separated into unit packages, extends through the through holes 210. Alternatively, package dicing may be carried out such that the through holes 210 are positioned inside the dicing lines.

The through holes 210 may have a vertical structure having a uniform cross-section (namely, the size of the through hole at the upper surface of the lower substrate 200 is identical to the size of the through hole at the lower surface of the lower substrate 200). Alternatively, the through holes 210 may have a vertical structure having a cross-section varying such that the size of the through hole at the upper surface of the lower substrate 200 is larger or smaller than the size of the through hole at the lower surface of the lower substrate 200.

Figure 8:
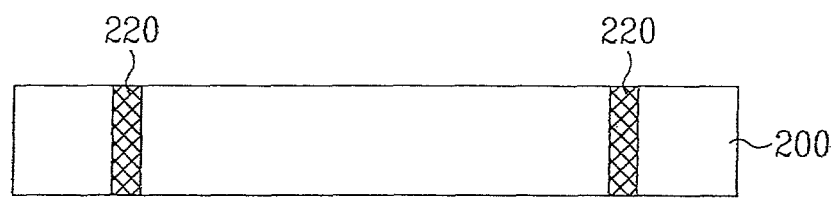

Subsequently, as shown in FIG. 8, a process for forming a metal film 220 made of a metal or other conductive material on the through holes 210 is carried out in accordance with a screen printing method or the like. The metal film 220 may completely fill each through hole 210, or may cover the inner surface of each through hole 210 in the form of a coating.

Figure 9:
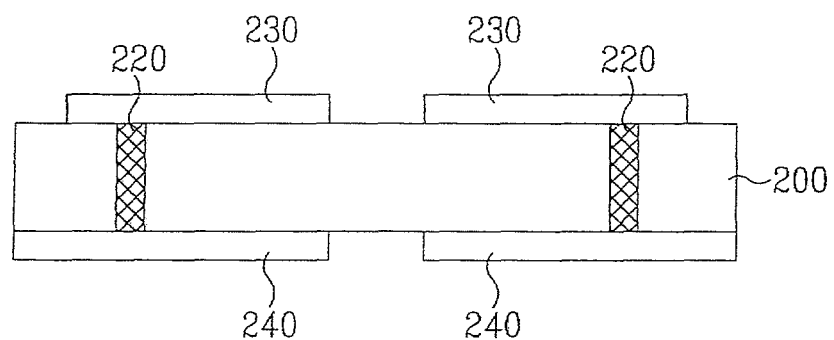
Figure 10:
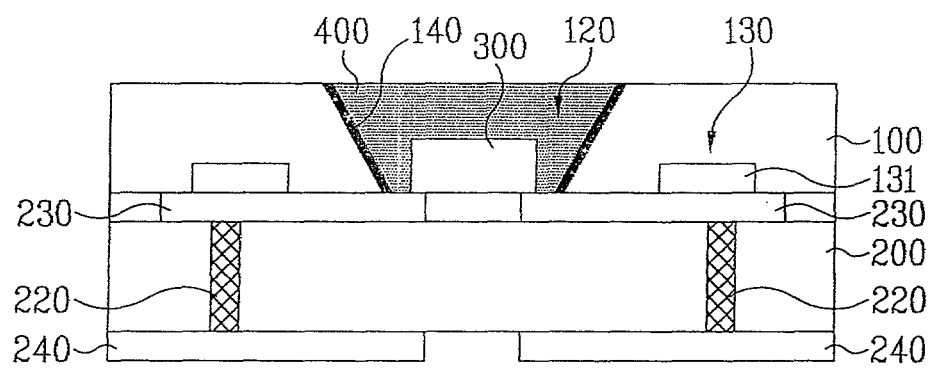

Thereafter, as shown in FIG. 9, metal layers are formed, as first and second electrodes 230 and 240, on a surface of the lower substrate 200, on which the light emitting device will be mounted, and a portion of the lower substrate 200 which will be electrically connected to the external circuit (not shown), respectively, are then patterned. For the convenience of description, each metal layer connected to the light emitting device will be referred to as a "first electrode 230", whereas each metal layer electrically connected to the external circuit will be referred to as a "second electrode 240".

Each first electrode 230 formed on the substrate portion, to which the light emitting device is bonded, is made of a metal exhibiting a high reflectivity at wavelengths in a visible ray range, ultraviolet ray range, and infrared ray range, namely, a metal such as Al, Ag, Cr, or Mo. Accordingly, light downwardly emitted from the light emitting device and light downwardly reflected from various mediums arranged above the light emitting device can be upwardly re-reflected. Thus, a further enhanced light extraction efficiency can be obtained.

Figure 11:
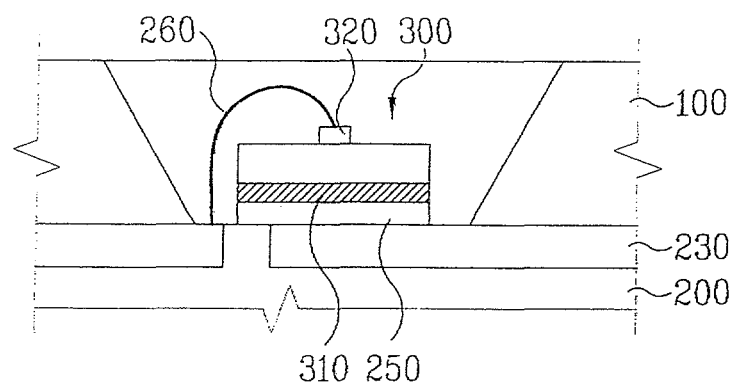
FIG. 11 is a sectional view illustrating an example of a method for mounting a light emitting device.

After completion of the above-described processes for the upper substrate 100 and lower substrate 200, the upper substrate 100 and lower substrate 200 are bonded to each other in an aligned state. Thereafter, the light emitting device 300 is bonded to the mounting hole 120 of the upper substrate 100 such that the light emitting device 300 is electrically connected to the first electrodes 230.

Where the light emitting device 300 has a vertical structure, namely, where the p-type electrode 310 and n-type electrode 320 are arranged at opposite surfaces, as shown in FIG. 11, the bonding of the light emitting device 300 is achieved by attaching one surface of the lower electrode of the light emitting device 300 (for example, the p-type electrode 310) to one first electrode 230 formed on the lower substrate 200, using a conductive epoxy resin 250, and electrically connecting the upper electrode of the light emitting device 300 (for example, the n-type electrode 320) to the other first electrode 230 of the lower substrate 200 in accordance with a wire bonding process using a wire 260.

On the other hand, where the light emitting device 300 has a horizontal structure, the bonding of the light emitting device 300 is achieved by bonding the insulating substrate portion of the light emitting device 300 to the first electrodes 230 of the lower substrate 200 or to the ceramic substrate in accordance with a flip chip bonding method, and electrically connecting the p-type electrode and n-type electrode arranged on the upper surface of the light emitting device 300 to the first electrodes 230 of the lower substrate 200 (not shown).

After the electrical connection of the light emitting device 300 to the first electrodes 230 of the lower substrate 200, a filler 400 such as a transparent epoxy resin or silicon gel may be filled in the mounting holes 120, in order to achieve an enhancement in light extraction efficiency.

On the other hand, when it is desired to change the wavelength of the light emitted from the light emitting device 300, phosphors may be contained in the filler 400 which may be a transparent epoxy resin or silicon gel.

For example, where a blue light emitting device is used for the light emitting device 300, it is possible to realize emission of a white light by adding yellow phosphors to the filler 400, and thus, enabling generation of a mixture of blue light and yellow light.

Figure 12:
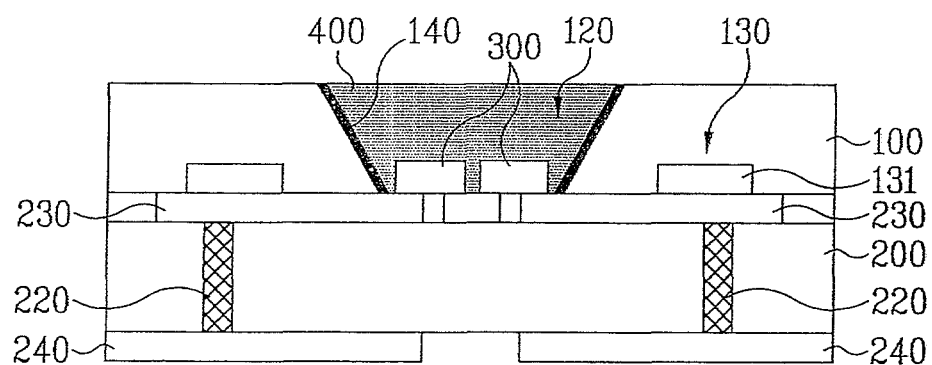
FIG. 12 is a sectional view illustrating a state in which a plurality of light emitting devices are mounted in the package according to the first embodiment of the present invention.

Although one light emitting device 300 may be mounted in the mounting hole 120, a plurality of light emitting devices 300, which emit light of the same color, may be mounted in the mounting hole 120, as shown in FIG. 12. Alternatively, light emitting devices, which emit red (R) light, green (G) light, and blue (B) light, respectively, may be mounted in the mounting hole 120, to realize a white light source.

Where a plurality of light emitting devices 300 are mounted, as described above, a plurality of first electrodes 230 may be formed for the mounting of the light emitting devices 300. A part of the plural first electrodes 230 may be bonded, in common, to at least two of the light emitting devices 300.

Thereafter, the package structure, which is formed by the upper substrate 100 and lower substrate 200 bonded to each other, as described above, is separated into individual packages. Thus, light emitting device packages are completely formed.

Meanwhile, the light emitting packages may be fabricated by separating the package structure including the substrates 100 and 200 into individual packages in accordance with a dicing process for mechanical separation of the substrates 100 and 200, and then bonding light emitting devices 300 to the separated packages, respectively.

Second Embodiment

Figure 13:
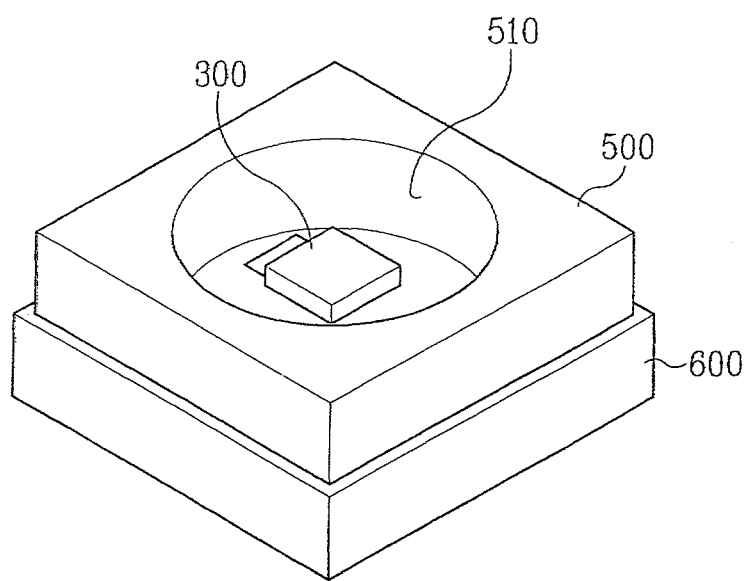
FIG. 13 is a perspective view illustrating a light emitting device package according to a second embodiment of the present invention.
Figure 14:
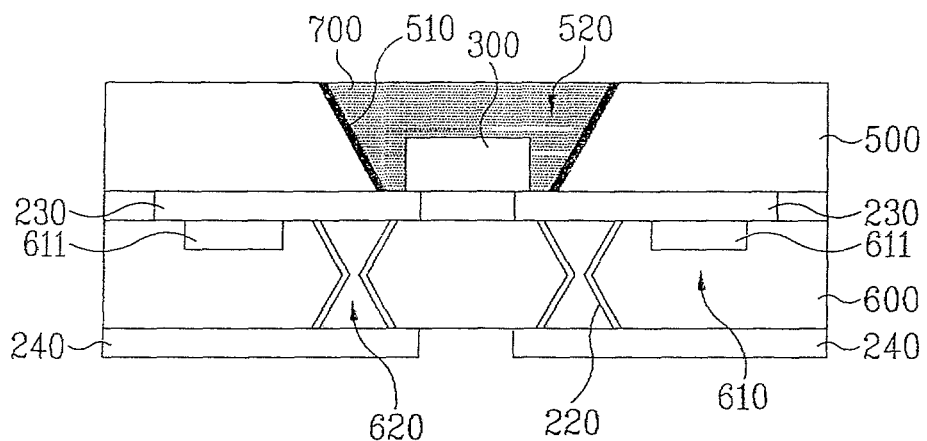
FIG. 14 is a sectional view illustrating the light emitting device package according to the second embodiment of the present invention.

Referring to FIGS. 13 and 14, a light emitting device package according to a second embodiment of the present invention is illustrated. The light emitting device package includes an upper substrate 500 and a lower substrate 600. A light emitting device 300 is mounted on the lower substrate 600. The upper substrate 500 is bonded to the lower substrate 600, and is provided with a reflection film 510 for forwardly reflecting light emitted from the light emitting device 300.

In the lower substrate 600, which may be a silicon substrate, zener diodes 610 are formed to achieve an improvement in the voltage withstand characteristics of the light emitting device 300.

A molding epoxy resin may be used for the upper substrate 500.

The upper substrate 500 or lower substrate 600 may be made of a material selected from PCB, BeO, SiO, Si, Al, $AlO_x$, PSG, a synthetic resin (plastic) material such as epoxy resin, ceramic, and $Al_2O_3$.

Through holes 620 may be formed through the lower substrate 600, using a bulk micro machining technique or a dry etch method. FIG. 14 illustrates an embodiment in which the through holes 620 are formed using a wet etch process.

When the lower substrate 600 is subjected to a wet etch process at opposite sides of the lower substrate 600, through holes 620, which have an inclination, are formed at the opposite sides of the lower substrate 600, as shown in FIG. 14.

When metal layers for formation of first electrodes 230 and second electrodes 240 are formed at the upper and lower ends of the through holes 620, a metal film 220 is formed in each through hole 620. Thus, the first electrodes 230 and second electrodes 240 are electrically connected by the metal film 220.

Each first electrode 230, which is formed in a region where the light emitting device 300 is bonded, is made of a metal exhibiting a high reflectivity at wavelengths in a visible ray range, ultraviolet ray range, and infrared ray range, for example, a metal such as Al, Ag, Cr, or Mo. Accordingly, it is possible to effectively reflect light emitted from the light emitting device 300, and thus, to achieve an enhancement in light extraction efficiency.

The lower substrate 600 has superior heat transfer characteristics of about 140 W/mk. Also, the lower substrate 600, which can be subjected to a semiconductor process, can have a reduced height. Accordingly, it is possible to achieve a reduction in thermal resistance.

Where the metal film 220 formed in each through hole 620 cannot exhibit a desired conductivity, it may be possible to reduce the resistance of the metal film 220, using an electroplating method.

The process for forming the zener diodes 610 in the lower substrate 600 may be identical to the process for forming the zener diodes 130 in the upper substrate 10 in the first embodiment. An impurity having a conductivity opposite to that of the lower substrate 600 is doped in the lower substrate 600, to form a diffusion layer 611.

As described above, the upper substrate 500 may be formed using a molding epoxy resin. When a mounting hole 520 is molded in the molding process, the inclination of the edge surface of the mounting hole 520 is set such that light laterally emitted from the light emitting device 300 can be forwardly reflected. A metal film having a high reflectivity is formed, as the reflection film 510, on the inner side wall surface (edge surface) of the mounting hole 520, in order to achieve a maximum reflection efficiency.

After completion of the above-described process, the upper substrate 500 and lower substrate 600 are bonded to each other in an aligned state.

Thereafter, the light emitting device 300 and first electrodes 230 are electrically connected. A filler 700 may then be filled in the mounting hole 520, to which the light emitting device 300 is bonded, using a transparent epoxy resin or silicon gel. Of course, phosphors may be contained in the filler 700, as in the first embodiment.

Figure 15:
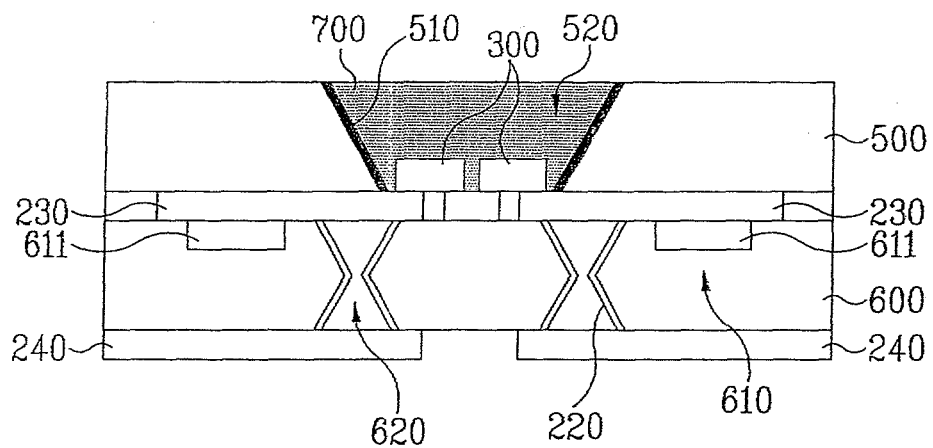
FIG. 15 is a sectional view illustrating a state in which a plurality of light emitting devices are mounted in the package according to the second embodiment of the present invention.

A plurality of light emitting devices 300, which emit light of the same color, may be mounted, as shown in FIG. 15, in order to achieve an enhancement in light power. Alternatively, light emitting devices 300, which emit red (R) light, green (G) light, and blue (B) light, respectively, may be mounted, to realize a white light source.

The remaining configurations of the second embodiment may be identical to those of the first embodiment, and so, no description thereof will be given.

Third Embodiment

Figure 16:
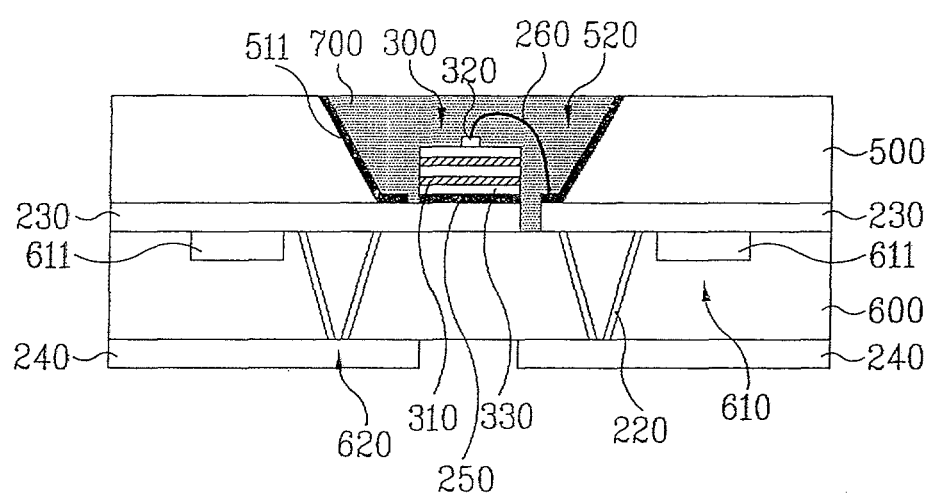
FIG. 16 is a sectional view illustrating a light emitting device package according to a third embodiment of the present invention.

Referring to FIG. 16, a light emitting device package according to a third embodiment of the present invention is illustrated. The light emitting device package includes an upper substrate 500 and a lower substrate 600. The lower substrate 600 is made of semiconductor such as silicon, and is formed with through holes 620 each having an inclination in one direction. The upper substrate 500 is formed with a mounting hole 520 for mounting a light emitting device 300.

The upper substrate 500 or lower substrate 600 may be made of a material selected from PCB, BeO, SiO, Si, Al, $AlO_x$, PSG, a synthetic resin (plastic) material such as epoxy resin, ceramic, and $Al_2O_3$.

A reflection film 511 is formed around the light emitting device 300. The reflection film 511 may extend along the inner side wall surface of the mounting hole 520 and the surface of the mounting hole 520 where the light emitting device 300 is mounted.

Each through hole 620 of the lower substrate 600 can be formed to have an inclination in a certain direction, in accordance with a wet etch process carried out in the direction. A metal film 220 is formed in each through hole 620.

FIG. 16 illustrates the case in which the light emitting device 300 has a vertical structure. As described above, current is applied, via the lower electrode 310 and upper electrode 320, to the light emitting device 300, which has a vertical structure.

The light emitting device 300 may include a support layer 330. In this case, the support layer 330 may be attached to one of the first electrodes 230, using a conductive epoxy resin 250.

Where the light emitting device 300 is formed on the support layer 330, the lower electrode 310 of the light emitting device 300 may include an ohmic electrode, and a reflection electrode arranged beneath the ohmic electrode. If necessary, a reflection electrode having ohmic characteristics (NiAg or NiAu-based reflection electrode) may be used.

The remaining configurations of the third embodiment may be identical to those of the first and second embodiments, and so, no description thereof will be given.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A light emitting device package, comprising:
a substrate comprising a first surface, a second surface, and a through hole;
a first electrode on the first surface, wherein the first electrode has a pair of portions;
a light emitting device on the first surface, wherein the light emitting device is arranged on the pair of portions, wherein the first electrode is electrically connected to the light emitting device;
a second electrode on the second surface, the second electrode electrically connected to the first electrode;
a zener diode on the first surface, the zener diode electrically connected to the first electrode,
wherein the zener diode is laterally arranged with respect to the light emitting device, and wherein a portion of the zener diode is configured to provide a reflective surface, and
wherein the light emitting device and the zener diode are arranged on a same side of the first electrode; and
an encapsulation on the light emitting device,
wherein a shortest distance between a flat surface of the light emitting device that is in contact with the first electrode and the first surface and a shortest distance between a flat surface of the zener diode that is in contact with the first electrode and the first surface are substantially the same.

2. The light emitting device package according to claim 1, wherein the zener diode comprises:
a semiconductor layer; and
a diffusion region on the semiconductor layer.

3. The light emitting device package according to claim 2, wherein the semiconductor layer has a first conductivity and the diffusion region has a second conductivity that is opposite to the first conductivity.

4. The light emitting device package according to claim 1, wherein the substrate comprises at least one material of PCB, BeO, SiO, Si, Al, $AlO_x$, PSG, a synthetic resin material, ceramic, and $Al_2O_3$.

5. The light emitting device package according to claim 1, wherein the substrate comprises Graphite.

6. The light emitting device package according to claim 1, wherein the light emitting device and the zener diode are located on a substantially same plane.

7. The light emitting device package according to claim 1, further comprising:
a phosphor material arranged on the light emitting device.

8. The light emitting device package according to claim 1, wherein the encapsulation contains a phosphor material.

9. The light emitting device package according to claim 8, wherein the phosphor material comprises a yellow phosphor material.

10. The light emitting device package according to claim 1, wherein the substrate has a heat transfer coefficient of 100 W/mK or more.

11. The light emitting device package according to claim 1, wherein the light emitting device is bonded to the first electrode with a conductive material.

12. The light emitting device package according to claim 1, wherein the second electrode is electrically connected to the first electrode via a metal or a conductive material arranged in the through hole.

13. The light emitting device package according to claim 12, wherein the through hole is partially filled with the metal or the conductive material.

14. The light emitting device package according to claim 1, wherein the light emitting device is on a center of the first surface.

15. The light emitting device package according to claim 1, wherein the first electrode comprises a metal having high reflectivity in at least one wavelength range of visible light, ultraviolet light, and infrared light.

16. The light emitting device package according to claim 1, wherein the first electrode comprises at least one of Cr and Mo.

17. The light emitting device package according to claim 1, wherein the encapsulation comprises epoxy or silicone.

18. The light emitting device package according to claim 1, wherein at least one of the second electrode and the through hole comprises a pair of portions.

19. The light emitting device package according to claim 18, wherein a shortest distance between the light emitting device and the zener diode is shorter than a shortest distance between the pair of portions of the through hole.

20. The light emitting device package according to claim 18, wherein the pair of portions of the first electrode and the pair of portions of the second electrode are connected via a metal or a conductive material arranged in the pair of portions of the through hole.

21. The light emitting device package according to claim 18, wherein widths of the pair of portions of the second electrode are substantially the same.

22. The light emitting device package according to claim 1, wherein the substrate has a rectangular parallelepiped shape.

23. The light emitting device package according to claim 1, wherein the first electrode and the second electrode directly contact the substrate.

24. The light emitting device package according to claim 1, wherein the zener diode is located a predetermined distance apart from a center of the first surface.

25. The light emitting device package according to claim 1, wherein the substrate comprises at least one of AlN and SiC.

26. The light emitting device package according to claim 1, wherein the first electrode covers the first surface.

27. The light emitting device package according to claim 1, wherein the light emitting device is on a first portion of the first electrode and the zener diode is on a second portion of the first electrode.

28. The light emitting device package according to claim 1, wherein a size of the through hole at the first surface is substantially the same as a size of the through hole at the second surface.

29. The light emitting device package according to claim 1, wherein first electrode is arranged between the zener diode and at least one through hole.

30. The light emitting device package according to claim 1, wherein the substrate includes at least a pair of through holes, and the zener diode is arranged outside of the pair of through holes.

* * * * *